US012181795B2

(12) United States Patent
Leccese et al.

(10) Patent No.: US 12,181,795 B2
(45) Date of Patent: Dec. 31, 2024

(54) METHOD FOR MANUFACTURING AN ACTIVE STRUCTURE FOR A RADIATION DETECTOR AND POLYMERIC MOLD FOR THE METHOD

(71) Applicant: ECOLE POLYTECHNIQUE FEDERALE DE LAUSANNE (EPFL), Lausanne (CH)

(72) Inventors: Veronica Leccese, Morges (CH); Michele Caldara, Geneva (CH); Marcello Pagano, Stäfa (CH); Arnaud Bertsch, Chavannes-pres-Renens (CH); Luca Müller, Sementina (CH); Alessandro Mapelli, Radazul (ES); Fabrizio Carbone, Crans-pres-Celigny (CH)

(73) Assignee: ECOLE POLYTECHNIQUE FEDERALE DE LAUSANNE (EPFL), Lausanne (CH)

( * ) Notice: Subject to any disclaimer, the term of this patent is extended or adjusted under 35 U.S.C. 154(b) by 231 days.

(21) Appl. No.: 17/846,136

(22) Filed: Jun. 22, 2022

(65) Prior Publication Data
US 2023/0418154 A1   Dec. 28, 2023

(51) Int. Cl.
*B29C 33/40* (2006.01)
*C08L 83/04* (2006.01)
(Continued)

(52) U.S. Cl.
CPC ............ *G03F 7/0002* (2013.01); *B29C 33/40* (2013.01); *C08L 83/04* (2013.01); *G01T 1/20* (2013.01); *C08L 2203/20* (2013.01)

(58) Field of Classification Search
CPC ......... G03F 7/0002; G01T 1/203; G01T 1/20; G01T 1/29; C08L 83/04
See application file for complete search history.

(56) References Cited

U.S. PATENT DOCUMENTS

| 4,942,302 A | 7/1990 | Koechner |
| 6,534,772 B1 | 3/2003 | Chhabra et al. |

(Continued)

FOREIGN PATENT DOCUMENTS

| WO | WO 2007093735 | 8/2007 |
| WO | WO 2013167151 | 11/2013 |

OTHER PUBLICATIONS

European Search Report for Application No. EP 23 17 8334, three pages, dated Nov. 1, 2023.
(Continued)

*Primary Examiner* — Emmanuel S Luk
*Assistant Examiner* — Debjani Roy
(74) *Attorney, Agent, or Firm* — Nixon & Vanderhye P.C.

(57) ABSTRACT

A method for manufacturing a scintillation detector structure including the steps of forming a plurality of first structures into a surface of a substrate to form a patterned substrate, filling the plurality of first structures and covering the surface of the substrate with a polymeric material, hardening the polymeric material and first removing the hardened polymeric material from the substrate to obtain a polymeric mold with a patterned surface having a plurality of second structures, performing a surface cleaning treatment and a silanization of the patterned surface of the polymeric mold, filling the plurality of second structures and covering the patterned surface of the polymeric mold with a moldable scintillation material, polymerizing the scintillation material while exerting a pressure on the scintillation material, and second removing the polymerized scintillation material from the plurality of second structures of the polymeric mold to obtain scintillation detector active structures.

13 Claims, 12 Drawing Sheets

(51) Int. Cl.
*G01T 1/20* (2006.01)
*G03F 7/00* (2006.01)

(56) References Cited

U.S. PATENT DOCUMENTS

| | | | |
|---|---|---|---|
| 6,892,010 | B2 | 5/2005 | Miao et al. |
| 7,652,261 | B1 * | 1/2010 | Wilson .................. G01T 1/16 |
| | | | 250/370.11 |
| 8,026,489 | B2 | 9/2011 | Haguenauer et al. |
| 9,219,093 | B1 | 12/2015 | Vora |
| 9,316,748 | B2 | 4/2016 | Mapelli et al. |
| 12,013,502 | B2 * | 6/2024 | Leccese ............... G01T 1/2033 |
| 2002/0074929 | A1 * | 6/2002 | Taskar ................. G01T 1/20 |
| | | | 313/467 |
| 2010/0065747 | A1 | 3/2010 | Haguenauer et al. |
| 2013/0260558 | A1 * | 10/2013 | Oota .................. C09K 3/1463 |
| | | | 438/693 |
| 2015/0105603 | A1 | 4/2015 | Mapelli et al. |
| 2021/0364660 | A1 | 11/2021 | Pittet et al. |

OTHER PUBLICATIONS

Office Action for U.S. Appl. No. 17/846,089, 12 pages, dated Aug. 8, 2023.
U.S. Appl. No. 17/846,089, filed Dec. 8, 2023, Leccese et al.
Gruber, L., & LHCb SciFi Tracker Collaboration. (2020). LHCb SciFi-Upgrading LHCb with a scintillating fibre tracker. Nuclear Instruments and Methods in Physics Research Section A: Accelerators, Spectrometers, Detectors and Associated Equipment, 958, 162025.
L. Muller, 'Development and characterization of photo-polymeric scintillating microfluidic waveguides', MSC Thesis, E'cole Polytechnique Fe'de'rale Lausanne, Lausanne (2016).
Leccese, V., Pagano, M., Carbone, F., Caldara, M., & Mapelli, A. (2021) Recent advances in MicroScint beam profiler technology. Poster presentation, SPS Meeting, Innsbruck (AUS).
Leccese, V., Pagano, M., Carbone, F., Caldara, M., & Mapelli, A. Recent advances in MicroScint beam profiler technology (2021) Poster presentation, PSD12, Birmingham (UK).
M. Pagano, 'Development of a high-resolution and high-frame rate beam profiler for medical accelerators', MSc Thesis, Politecnico di Torino, Italy, E'cole Polytechnique Fe'de'rale Lausanne, Lausanne (2021).
Maoddi, P. (2015). Microfluidic scintillation detectors for high energy physics (No. 6620 Thesis). EPFL. pp. 23-32.
Mapelli, A. (2011). Scintillation Particle Detectors Based on Plastic Optical Fibres and Microfluidics (Doctoral dissertation, Ecole Polytechnique, Lausanne). p. 98.
Ozkan Loch, C., Eichenberger, M. A., Togno, M., Zinsli, S. P., Egloff, M., Papa, A., . . . & Safai, S. (2020). Characterization of a low-cost plastic fiber array detector for proton beam dosimetry. Sensors, 20(20), 5727.
Rojatti, E., Calvi, G., Lanzavecchia, L., Parravicini, A. , & Viviani, C. (2016). Study of the radiation damage on a scintillating fibers based beam profile monitor, TUPG68 Proceedings of IBIC2016, Barcelona, Spain.
Zimmermann, C. J., Ryde, N., Kallay, N., Partch, R. E., & Matijević, E. (1991). Plasma modification of polyvinyltoluene and polystyrene latices. Journal of materials research, 6(4), 855-860.

* cited by examiner

Beam energy = 178 MeV

Beam energy = 220 MeV

METHOD FOR MANUFACTURING AN ACTIVE STRUCTURE FOR A RADIATION DETECTOR AND POLYMERIC MOLD FOR THE METHOD

CROSS-REFERENCE TO RELATED APPLICATIONS

The present patent application is related to the concurrently filed U.S. patent application with the Ser. No. 17/846,089 filed on Jun. 22, 2022, the entire contents thereof herewith incorporated by reference in its entirety.

FIELD OF THE INVENTION

The present invention is directed to the field of scintillation detectors, methods of manufacturing scintillation detectors, for example for use of different types of radiation-based medical imaging or radiation treatment of tumors.

BACKGROUND

The state of the art fiber-based particle beam detectors and profilers suffer from radiation damage after a few years of use. For example, U.S. Pat. No. 8,026,489, this reference herewith incorporated by reference in its entirety, describes a detector using a fiber-optic network having a plurality of scintillating optical fibers, the fibers arranged in parallel in an X-direction and a perpendicular Y-direction forming a network, the fibers guided with armatures to an imaging plane of an imaging device, for example a CCD or CMOS image sensor. However, this design requires the precise arrangement of many different fibers which is quite expensive knowing that for each particle accelerator many beam profilers are necessary. For example, the difficulties are related to the need of precise positioning and adhesion of large sets of thin fibers on support plates or other structures which is very challenging to successfully assemble a full-scale detector with suitable resolution. Also, it has been shown that the fibers can easily damage due to their exposure to the proton beam.

As an alternative, in the state-of-the art, the use of liquid scintillation material has been proposed, as the liquid scintillator material is that it can be readily replaced, however, the manufacture turns out to be quite demanding. For example, in U.S. Pat. No. 9,316,748, this reference herewith incorporated by reference in its entirety, a scintillation detector is described that uses a liquid scintillation material arranged in channels that are in fluid communication with each other. In addition, when manufacturing scintillator devices using scintillation liquid, the capillarity of the channels during the filling stage is problematic.

These capillarity effects are in general governed by the interplay between surface tension of a liquid and the geometry and surface chemistry of a cavity that can serve as a solid support. The filling stage of the microchannels depends on different factors, including the geometry and the material of the microchannels, the flow velocity/pressure, the contact angle of channel surface and the liquid surface tension. Small variations of these parameters or impurities due to the fabrication process can result in a different filling time, dead zone formation and air bubble trapping. For these reasons, it is very difficult and costly to make channels or other structures that are very small, thereby strongly limiting the resolution of the scintillation detector. In addition, the scintillation detectors that use liquid scintillation material are strongly limited in their application field and use, as they cannot be used inside a vacuumized environment, for example for cyclotrons, synchrotrons or medical linear accelerators (LINAC), and other radiation equipment requiring a vacuum area for beam transport and detection.

Therefore, in light of the above described deficiencies of the state of the art, advanced scintillation structures and methods of manufacturing such scintillator structures is strongly desired, to manufacture devices with increased resolution of the detector, facilitate the optical readout, to reduce manufacturing costs, and to provide for a simplified design.

Accordingly, in light of the above-described deficiencies of the state of the art, there is the clear need to new, low-cost, high-resolution, scintillation structures, and methods of manufacturing thereof.

SUMMARY

According to one aspect of the present invention, a method for manufacturing a scintillation detector structure is provided. Preferably the method includes the steps of forming a plurality of first structures into a surface of a substrate to form a patterned plate, filling the plurality of first structures and covering the surface of the patterned substrate with a polymeric material, hardening the polymeric material and first removing the hardened polymeric material from the patterned substrate to obtain a polymeric mold with a patterned surface having a plurality of second structures, performing a surface cleaning treatment and a silanization of the patterned surface of the polymeric mold, filling the plurality of second structures and covering the patterned surface of the polymeric mold with a moldable scintillation material, polymerizing the scintillation material while exerting a pressure on the scintillation material, and second removing the polymerized scintillation material from the plurality of second structures of the polymeric mold to obtain scintillation detector active structures.

According to another aspect of the present invention, a scintillation detector structure is provided, manufactured according to the method described herein.

Moreover, according to yet another aspect of the present invention, a polymeric mold for manufacturing a scintillation detector structure from a moldable polymeric resin is provided. Preferably, the polymeric mold includes a mold body having a surface structuration with openings on one side of the mold, the openings defining at least partially a geometry of the scintillation detector structure, a surface of the mold body that forms the surface structuration includes a silanized layer.

The above and other objects, features and advantages of the present invention and the manner of realizing them will become more apparent, and the invention itself will best be understood from a study of the following description with reference to the attached drawings showing some preferred embodiments of the invention.

BRIEF DESCRIPTION OF THE SEVERAL VIEWS OF THE DRAWINGS

The accompanying drawings, which are incorporated herein and constitute part of this specification, illustrate the presently preferred embodiments of the invention, and together with the general description given above and the detailed description given below, serve to explain features of the invention.

Herein, identical reference numerals are used, where possible, to designate identical elements that are common to the figures. Also, the images are simplified for illustration purposes and may not be depicted to scale.

DETAILED DESCRIPTION OF THE EMBODIMENTS

According to one aspect of the present invention, and as illustrated with the stages depicted in FIGS. 1A to 1G, a method 100 for manufacturing a scintillation detector structure is provided. First, a step S10 of forming a plurality of first structures 15 into a surface of a substrate 10 is provided, for example into a silicon wafer substrate, to form a patterned substrate into the substrate. This can be done by a plurality of first structures includes a photolithography or electron-beam lithography process with a photoresist, pattern the photoresist, etch the first structures 15 into a surface of a substrate 10, and a removal of the photoresist layer. The first structures 15 will have the shape and form of the scintillations structures that result from the method 100 as further discussed below, for example a plurality of columns having a square-shaped cross-section, and in FIG. 1A these are shown in a cross-sectional view in a direction of extension of surface channels, grooves, or trenches.

Figure 1A:
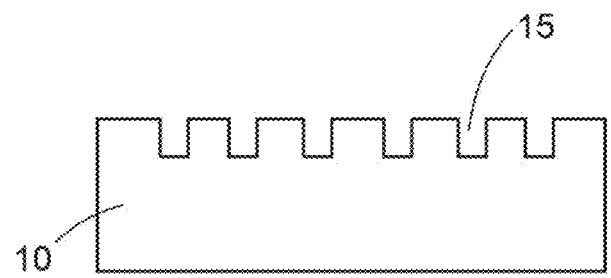
FIGS. 1A to 1G show different views of the stages of the method 100 for manufacturing a scintillation detector structure, with FIG. 1A showing a side view of substrate that has been patterned to form first structures into a surface, to thereby form a mold, FIG. 1B showing a side view of a stage where the first structures have been filled and covered by a polymeric material, FIG. 1C showing a side view of the polymeric mold after hardening of the polymeric material and removing the hardened polymeric material from the patterned substrate, the polymeric mold having a plurality of second structures in an upper surface, FIG. 1D showing a side view of the polymeric mold after a surface cleaning treatment and a silanization of the patterned surface of the polymeric mold, FIG. 1E showing a side view of the polymeric mold having scintillation resin SR poured or filled into the patterned surface, FIG. 1F showing a side view where a pressure is exerted onto the polymeric mold that has the second structures filled with scintillation resin SR, and the polymerization is performed under pressure, by the use of a weight and a layer of polymer, and FIG. 1G showing a top view of the polymerized scintillation material that has been removed from the plurality of second structures of the polymeric mold to obtain scintillation detector active structures, in the variant shown two sets of scintillation columns, the sets arranged to extend perpendicular to each other.
Figure 1B:
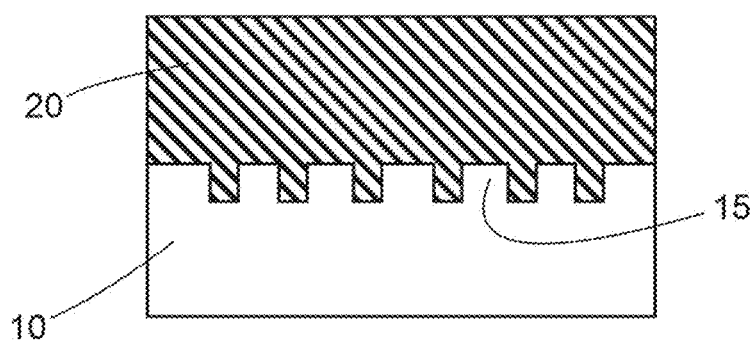

Next, a step S20 is provided, where a polymeric material 20 is filled into the plurality of first structures 15 of substrate 10 such that polymeric material 20 covers the surface of the substrate 10, as illustrated in the side view of FIG. 1B. Preferably, the polymeric material includes Polydimethylsiloxane (PDMS). For step S20, the polymeric material can be prepared with the PDMS and a curing agent at a ratio of 10 to 0.5 by weight, mixed and degassed under vacuum to remove the bubbles and trapped air. Usually, for preparing PDMS, the ratio between PDMS and the curing agent is 10:1 by weight, but for the method described herein the ratio 10 to 0.5 by weight is used to make the PDMS softer thereby facilitating the removal or demolding step, as described below with step S30. After the degassing process, the polymeric material can be poured into first structures 15 of substrate 10, for example a silicon wafer substrate, that has a silanized surface with the silanization material being TMSC (Chlorotrimethylsilane), degassed under to eliminate the remaining air bubbles and cured in the oven or heat chamber at 80° C. for at least 3 hours. The PDMS is a suitable polymeric material 20, for its elastomeric properties that are highly beneficial for the removal of polymeric material 20 from the substrate 10. Other polymeric materials can be used instead of PDMS, for example polymeric materials that have similar properties as PDMS, in terms of elasticity, temperature resistance, for example a similar glass transition temperature, and similar hydrophobic surface properties. For example, other materials that can be used for the polymeric material 20 can be but is not limited to Polystyrene, Polycarbonate, or Flexdym™ polymer from the company Eden Tech, or a combination of these materials.

Figure 1C:
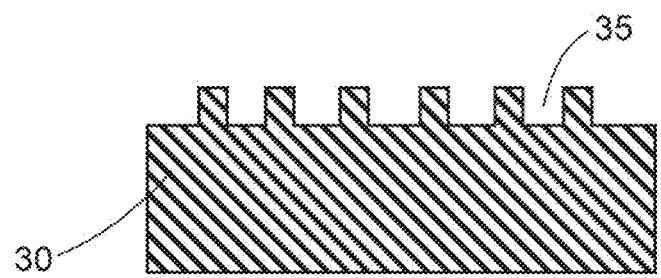

Thereafter, a step S30 is provided of hardening the polymeric material 20, and removing the hardened polymeric material 20 from the patterned substrate 10 to obtain a polymeric mold 30 with a patterned surface having a plurality of second structures 35, as shown in FIG. 1C. For example, this step S30 can be performed by demolding the hardened polymeric material from the patterned substrate by peeling. For example, after cooling the hardened polymeric material 20, it manually demolded from substrate 10 and cut in the desired shape, to obtain the polymeric mold 30.

Figure 1D:
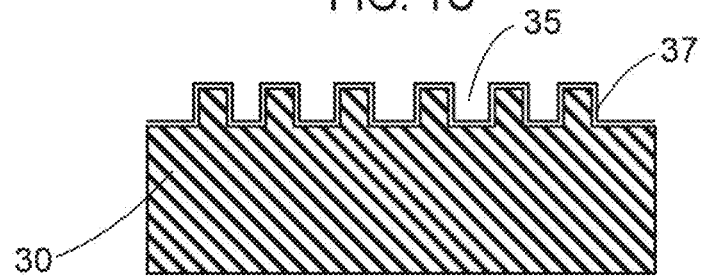

Next, a step S40 can be performed where a surface cleaning step is performed, for example by a chemical polishing step, and a step of silanizing the patterned surface of the polymeric mold 30, for example by using a perfluoro-terminated silane, to obtain a silanized layer 37 at the patterned surface of polymeric mold 30, as illustrated in FIG. 1D. For example, the performing of the silanization of the patterned surface of the polymeric mold 30 can be done by using a perfluoro-terminated silane to increase a hydrophobicity of the patterned surface of the polymeric mold 30 creating a fluorinated monolayer as an exemplary the silanized layer 37. For example, step S40 can include a silanization process where a silane is evaporated onto a surface of the polymeric mold 30, for example by using Perfluoroctyltriethoxysilane (PFOTS) as an exemplary silane, and before the surface silanization, a pre-processing step can be performed where the surface polymeric mold 30 can be activated with oxygen plasma, for example for 45 seconds or more with a power of 20 W. To perform the silanization process, about 100 μL to 500 μL of silane can be placed in a container such as a vial, and the container including the polymeric mold 30 are placed in a vacuum chamber at a pressure of about 65000 to 70000 pascal, for example for at least two (2) hours or more, such that the silane evaporates and creates a monolayer of fluorine-terminated silanes on a surface of the polymeric mold 30, and this monolayer later prevents scintillation material 45 from adhering to the mold 30.

Figure 1E:
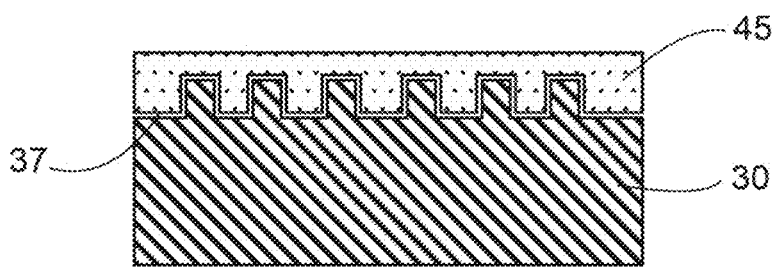
Figure 1F:
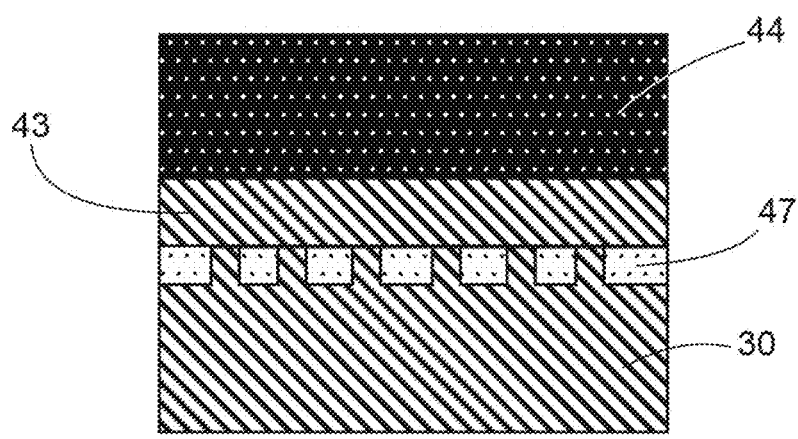
Figure 1G:
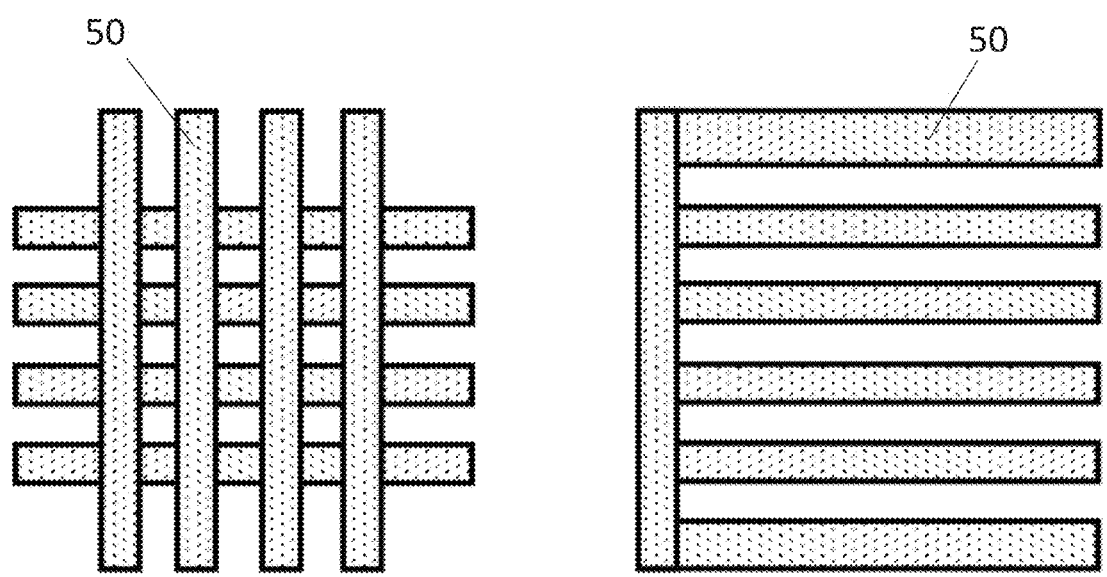
Figure 2:
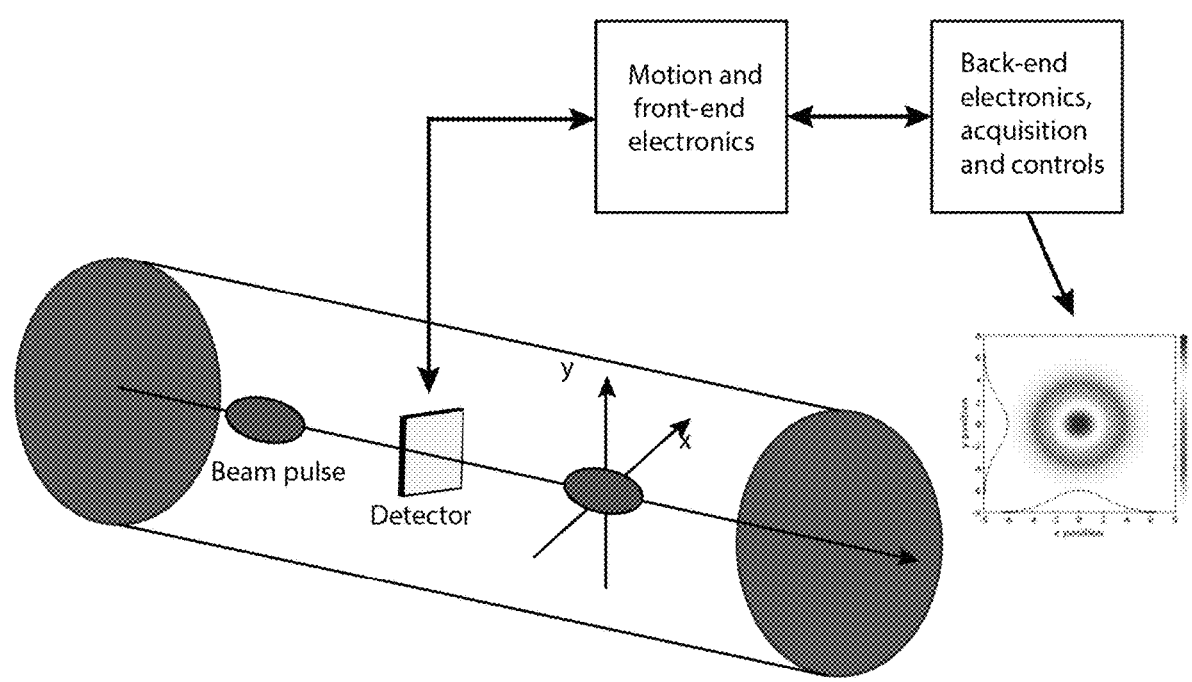
FIG. 2 shows an exemplary representation of a medical imaging radiation system that can operate in a beam profiler operation, according to another aspect of the present invention, showing scintillation device that can be irradiated by a beam, the scintillation device having a scintillation detector structure 50 as described herein, and including motion and front-end electronics that are operatively interconnected to a photodetector system, and including back-end electronics, acquisition, and control, for generating and displaying radiation images of an irradiated subject.

Moreover, a step S50 of filling the plurality of second structures 35 and the silanized layer 37 of polymeric mold 30 with a moldable scintillation material 45 is performed. In this step, after filling the scintillating material 45 into the second structures 35, a degassing process under vacuum can be used to remove any bubbles or trapped air, for example by using a desiccator or other type of sealable enclosure. In this step, the patterned surface and the silanized layer 37 of the polymeric mold 30 can be covered with a moldable scintillation material 45, as illustrated in FIG. 1E, for example by using a scintillation resin SR such as but not limited to the commercially available EJ-290 plastic scintillator casting resin manufactured by Eljen Technology. The EJ-290 is a polyvinyltoluene-based (PVT-based) partially-polymerized plastic scintillator. For example, the EJ-290 product is made of three different components or parts A, B, C, with a resin A, a monomer B, and a catalyst C, and the monomer part B can be increased until a desired viscosity is reached for moldable scintillation material 45 for the step S50. Other scintillation resins can be used, such as but not limited to the product BC-490 Plastic Scintillator Casting Resin from Saint-Gobain. For example, the step S50 can be performed by pouring using gravity or by spin-coating. Preferably, for this step, the viscosity of the resin can be in a range between 0.5 and 100 Pa·s.

Once the moldable scintillation material 45 has moved inside the different cavities and openings of the second structure 35 of polymeric mold 30 with step S50, a step S60 of polymerizing the scintillation material 45 while exerting a pressure on the scintillation material 45 can be performed, for example with a contact layer 43 and a weight 44 or other type of device for applying a pressure to scintillation material 45 via contact layer 43, to obtain a polymerized scintillation material 47. Preferably, the contact layer 43 is made of a polymeric material, more preferably from PDMS, that also has a silanized layer as the contact surface to scintillation material 47. As the polymeric mold 35 has a silanized layer 37, the solvent that is included in the scintillation material 45 cannot enter the polymeric material of both the mold 30 and the contact layer 43. When applying the pressure, the step can be configured such that after a certain time during the step S60, the contact layer 43 will come into contact with the upper surface portions of polymeric mold 30. In a variant, the pressure is such that the upper surface portions of polymeric mold 30 remains covered by a small film or layer of scintillation material 47, to provide for an interconnection of the scintillation material 47 that is formed in the channels. The polymerization process of step S60 can include a heat treatment step, for example a heat treatment during four (4) hours or more at about 80° C., for example by the use of a heating chamber with fume evacuation, for example an oven with a fume hood. Before the polymerization the resin is toxic, and therefore it is preferably to use a system that allows to evacuate the fumes, such as a fume hood. During the heating, a pressure can applied to the resin, with the use of the contact layer 43 and weight 44 that can come into contact with the resin, or another device for exerting a constant pressure, for example but not limited to a press, clamp, for example to exert a pressure, for example a pressure in a range of about 1000 pascals to 20000 pascals.

Thereafter, a step S70 of removing the polymerized scintillation material 47 from the plurality of second structures 35 of the polymeric mold 30 to obtain scintillation detector active structures 50, for example a plurality of scintillator columns, or a scintillator grid. Other types of scintillation structures are also possible. For example, this step S70 can include a demolding of the polymerized scintillation material 47 by a mechanical removal. The silanization performed on polymeric mold 30 of step S40 makes the mechanical demolding possible to avoid strong adhesive forces. In a variant, the polymeric mold 35 can be dissolved with a solvent. PDMS molds can be used to make soluble molds, for example isomalt molds. The resin can be poured into a soluble mold and polymerized following the same procedure described before. After the polymerization, the mold can be dissolved in its solvent. In the case of a soluble isomalt mold, the solvent would simply be water. Using a soluble mold avoids the demolding process, which becomes can be more difficult for more complex patterns and forms of scintillation detector active structures 50. Because of the non-polarity and non-proticity of scintillator material 47 as a resin, an organic material such as isomalt, a very polar and protic sugar, has been tested to build sacrificial molds starting from PDMS molds. The isomalt material was melted and poured into PDMS molds, for example the herein described polymeric mold 30. When cooled, the isomalt material was removed from the PDMS mold and itself used as a soluble mold that was filled with scintillator material 47, to obtain scintillation structures. Also in this case, as for the case of PDMS mold, a step S60 is performed to apply a pressure and polymerize the scintillation material 47. After the resin polymerization, with a step S70 of removing, the soluble mold can be dissolved, and the scintillating active areas 50 are obtained. Such an alternative is thought to avoid the demolding process when the design of the active area is particularly complex.

Figure 3A:
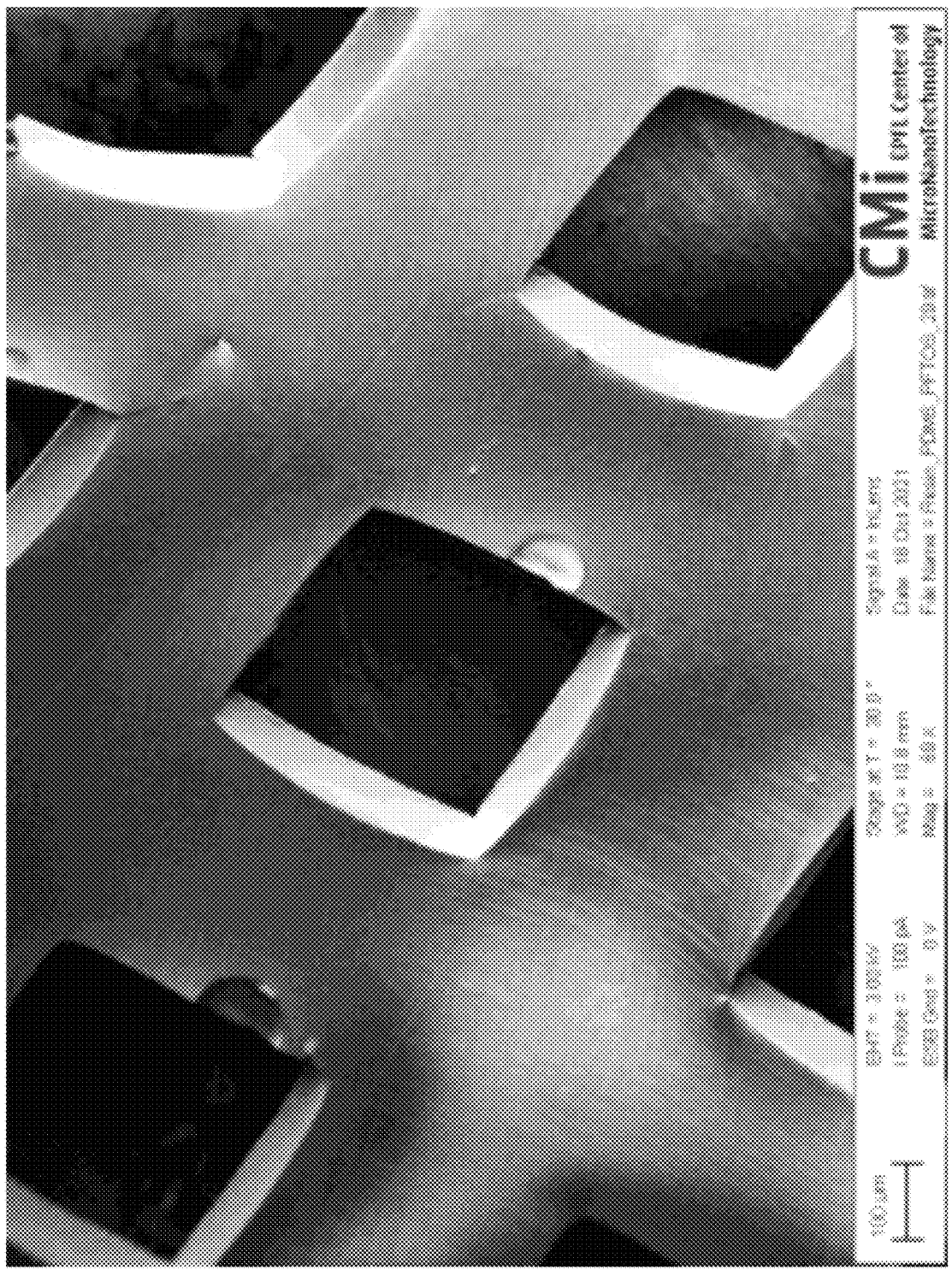
FIGS. 3A to 3D shows different images made by a scanning electron microscope (SEM) from scintillation detector active structures in the form of grids and channels, fabricated with PDMS polymeric molds, with FIG. 3A showing an active structure made as a grid with holes having an exemplary square shape with the dimensions of 250 µm to 250 µm arranged in a matrix with a pitch of 500 µm, FIGS. 3B, 3C, and 3D showing different perspective views of SEM images of channels made of resin having an exemplary pitch of 250 µm.
Figure 3B:
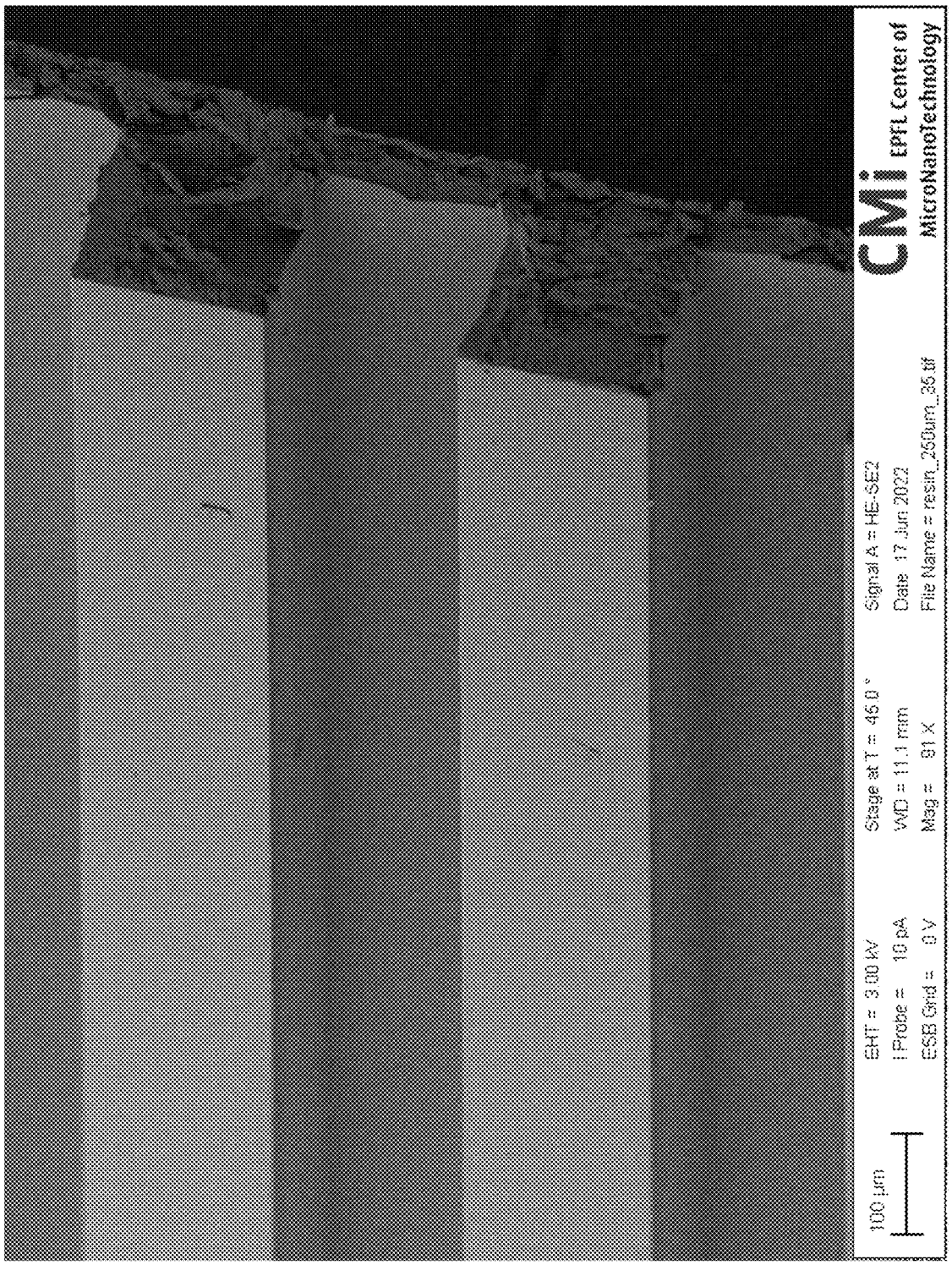
Figure 3C:
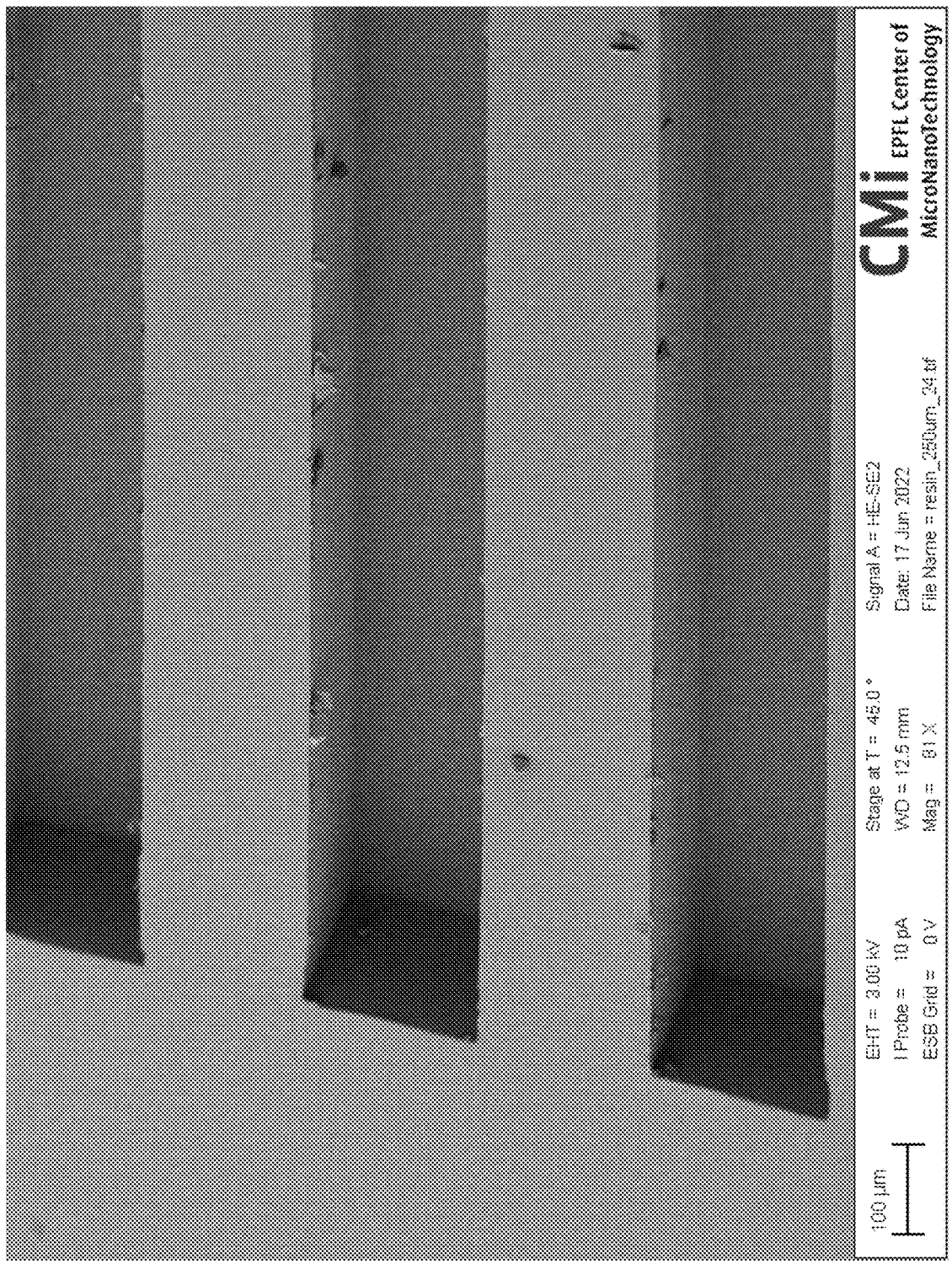
Figure 3D:
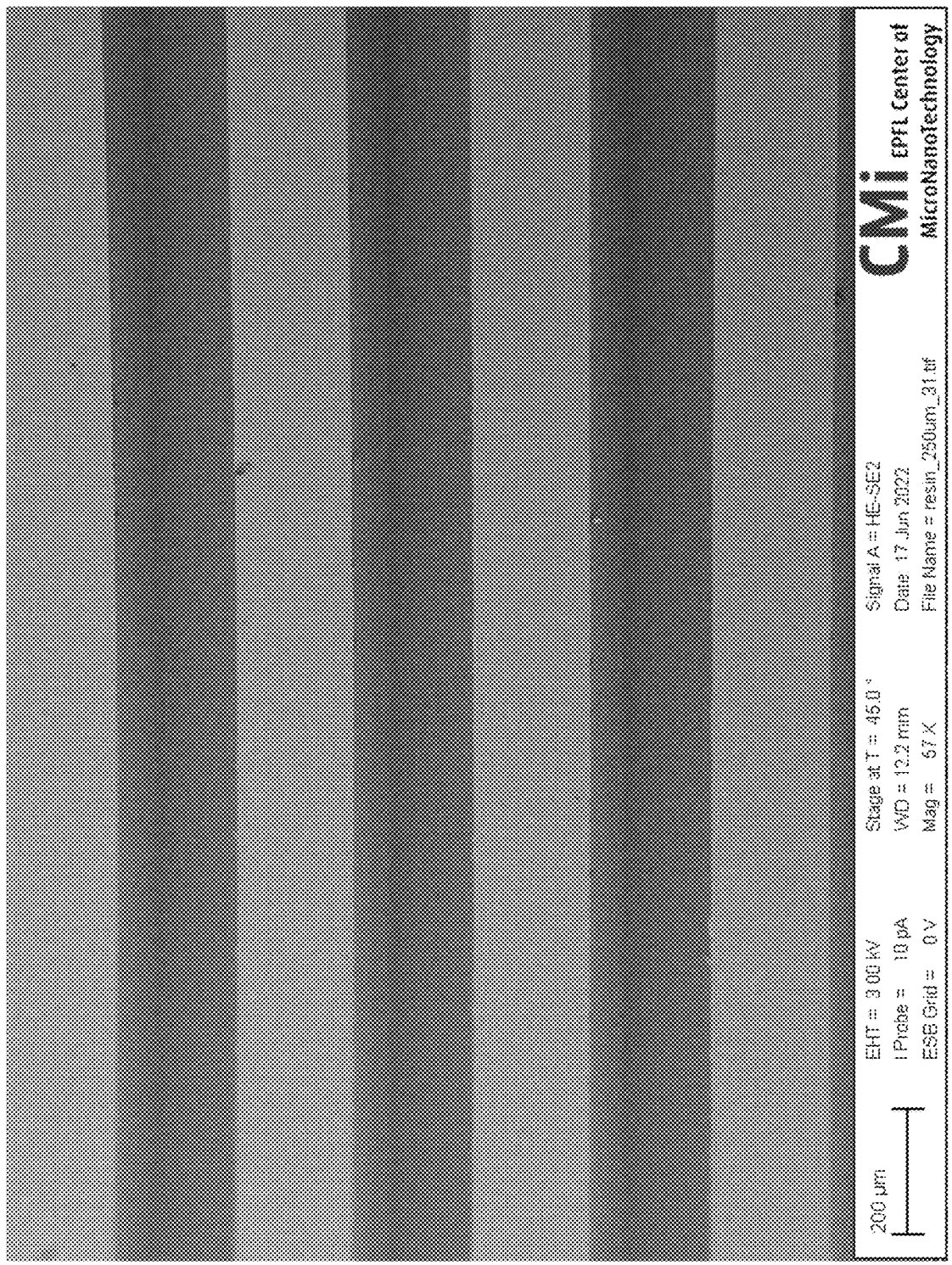

As shown with the SEM images of FIG. 3A, an exemplary scintillation detector active structure 50 in the form of a grid has been manufactured with the method 100 described above, with a branch or channel pitch of about 500 μm, with a grid hole size of about 250 μhaving an exemplary square shape. The grid design was chosen to be able to allow 2D reconstruction of the beam profile, by integrating arriving photons with arrays of photodetectors PD that can be arranged at the end of each branch of the grid, at the side walls in two dimensions. FIGS. 3B, 3C, and 3D showing different perspective views of SEM images of channels made of resin having an exemplary pitch of 250 µm. The width of the half pitch of the grid of active structure 50 for the grid and the channels shown in FIGS. 3A to 3D is only representative, and from a fabrication perspective there is the possibility to have larger or smaller widths relative to the pitch, depending on the application. As can be seen in FIGS. 3A to 3D, grid-like and channel scintillation detector active structure 50 were obtained with vertical sidewalls, which is a necessary feature for efficient photon transportation. Also, it can be seen that the removal of structure 50 from polymeric molds 30 with step S70 did not induce any cracks. As scintillation material, a commercial scintillating resin EJ-290 by Eljen Technology was used. With the herein presented method 100, it was possible to create fine scintillation detector active structures 50 with microscopic dimensions that has not been achieved before, and even in the nanometer range.

Figure 4:
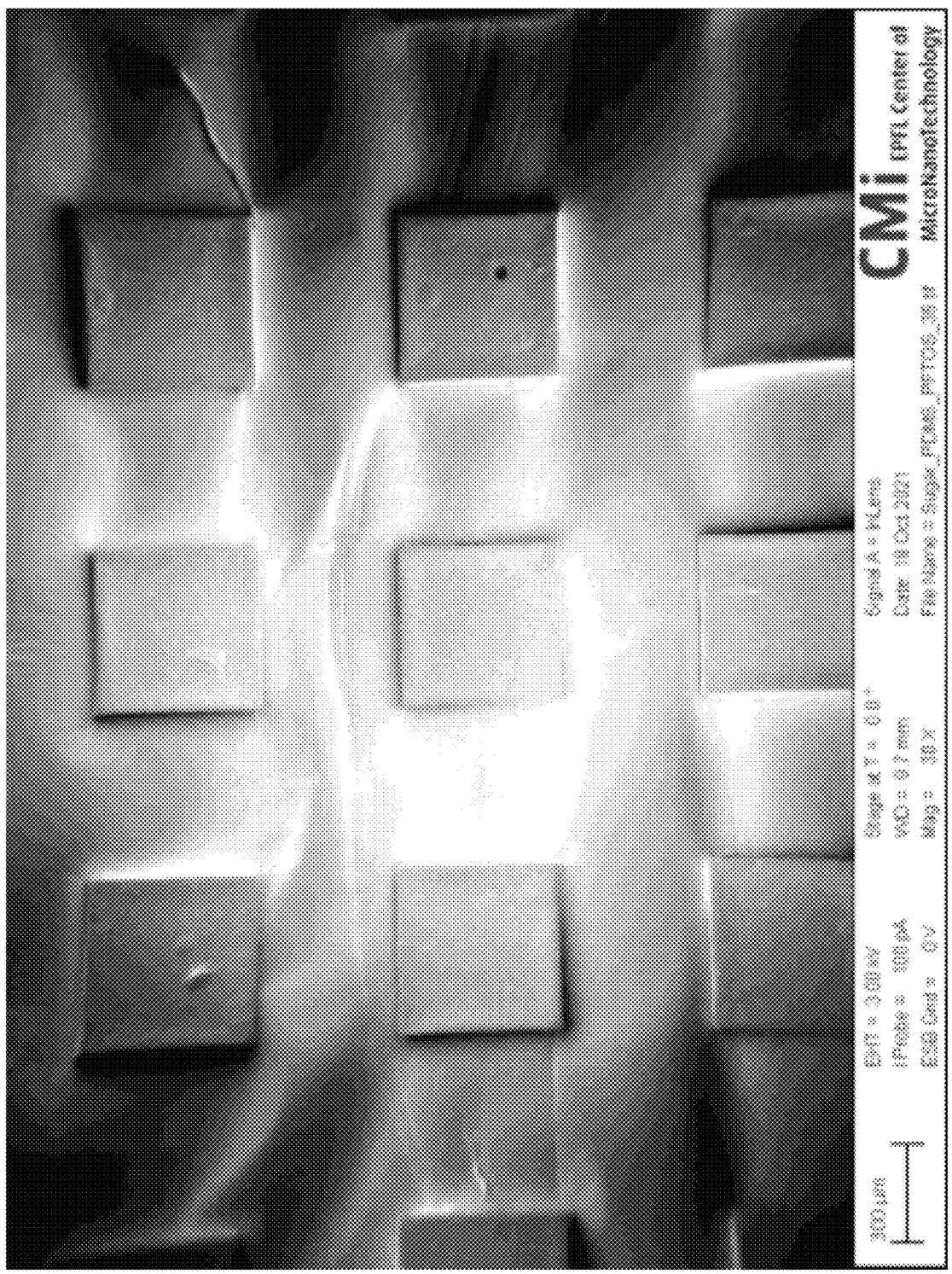
FIG. 4 is showing an SEM image of the scintillating resin SR after polymerization, where it can be seen that the pressure exerted onto the scintillation resin SR during the polymerization step was such that a layer of scintillation material 47 still remains on the upper surfaces of mold 30, so that no holes for the grid were formed.

FIG. 4 shows an SEM image of the scintillating resin SR after polymerization, where it can be seen that the pressure exerted onto the scintillation resin SR during the pressure and polymerization step S60 was insufficient, so that no holes for the grid were formed.

With respect to operational principle of the resin-based active area as a waveguide, for example by using the scintillation detector active structures 50 described herein, the operation is similar to the one of a scintillating fiber. A scintillating fiber is composed by a core of scintillating material, surrounded by a plastic cladding. The light that is generated inside the core can be guided trough the fiber only if the refractice index of the cladding refractive index ($n_{cladding}$) is lower than the core ($n_{core}$). A portion of the light that hits the core-cladding interface with an angle bigger than the critical angle (θc) is guided inside the core material due to the total internal reflection (TIR) phenomenon. The equation to define the critical angle θc is derived from Snell's law in the particular case in which the light at the interface is not transmitted in the cladding material but forms a 90° angle with the normal to the interface. The equation below shows the result of the derivation and highlights the importance of having $n_{core} > n_{cladding}$.

$$\theta_c = \arcsin(n_{cladding}/n_{core})$$

In the case of resin-based active area, for example the herein described structures 50, as these structures 50 are not coated with a cladding layer, the air or a vacuum acts as cladding, meaning that the collection angle is large and much more photons are guided through the channels.

Figure 5A:
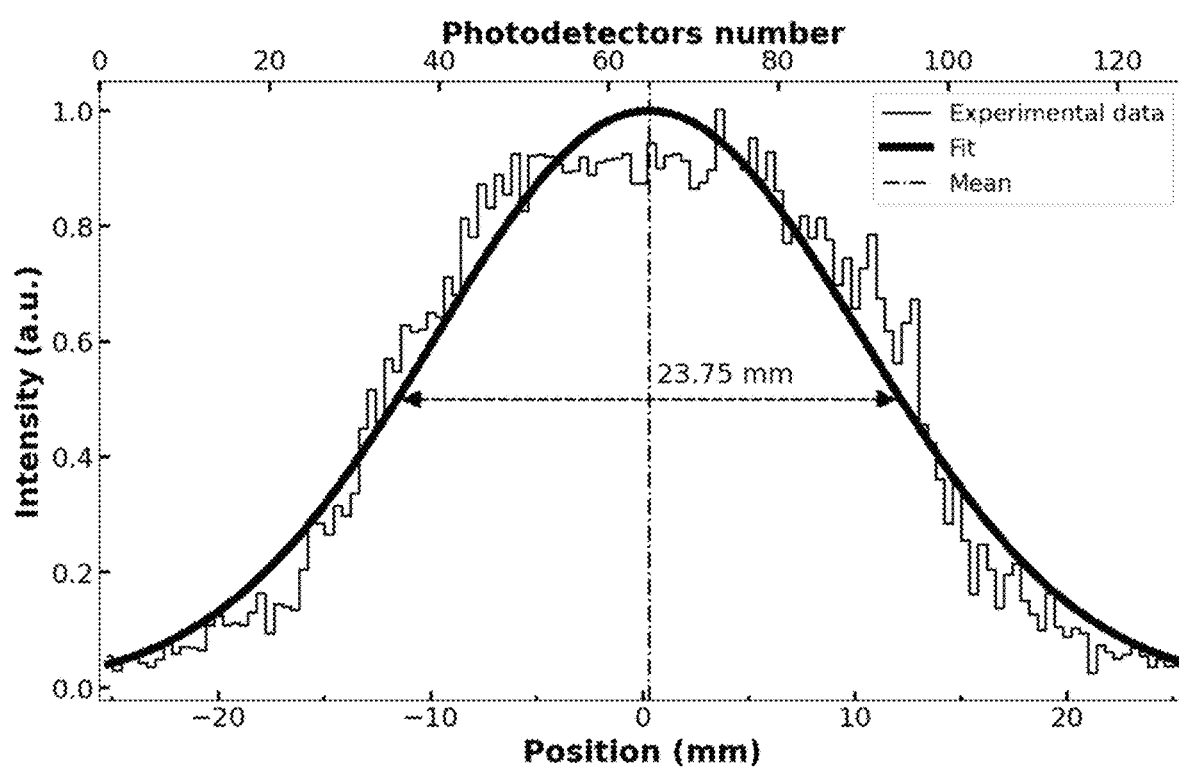
FIGS. 5A to 5C show different experimental results with scintillation detector structure 50 as manufactured by the herein described method 100, showing profiles of proton beams that have been received by exemplary photodetectors PD, for example with 128 exemplary photodetector diodes, showing the reproduction of the Gaussian distribution of the original proton beam, at different energies, with FIG. 5A showing a graph with the read signal intensity as a function of a number of a photodetector from the array of photodetectors PD that is capturing the light emitted from scintillation columns of detector structure 50 with a beam energy of 150 MeV, FIG. 5B showing a graph for the beam energy of 178 MeV, and FIG. 5C showing a graph for the beam energy of 220 MeV.
Figure 5B:
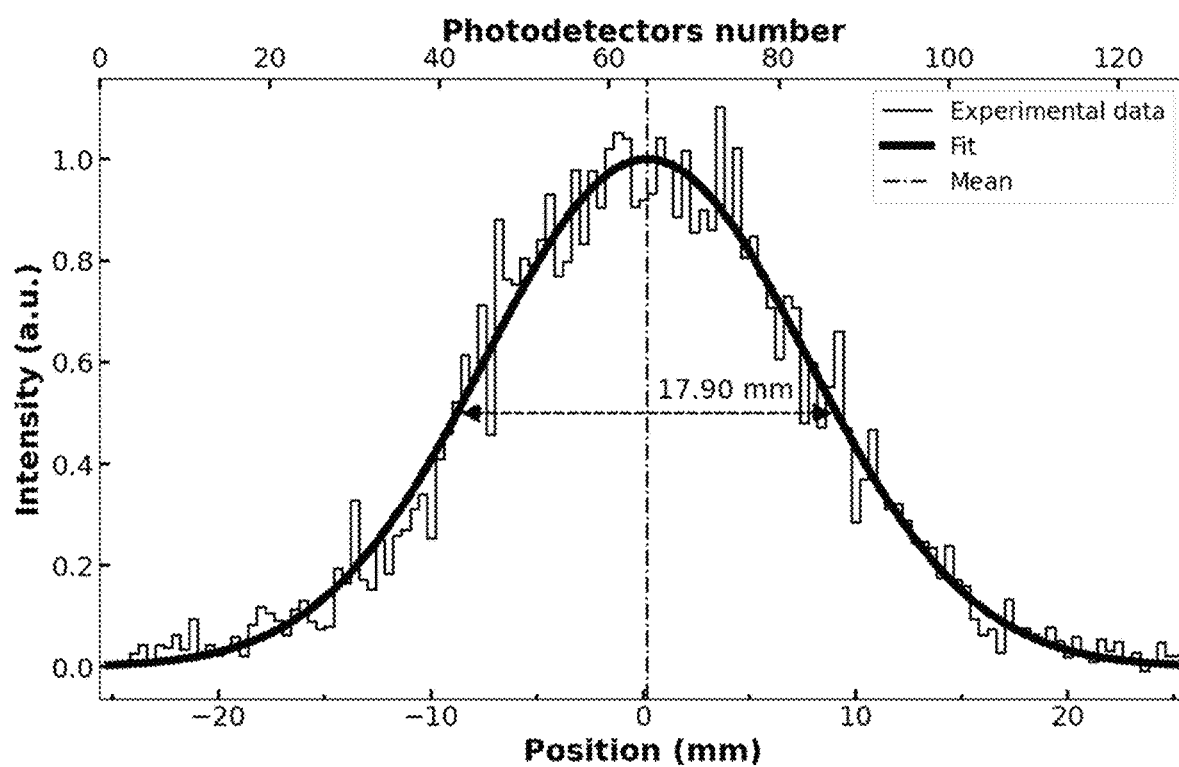
Figure 5C:
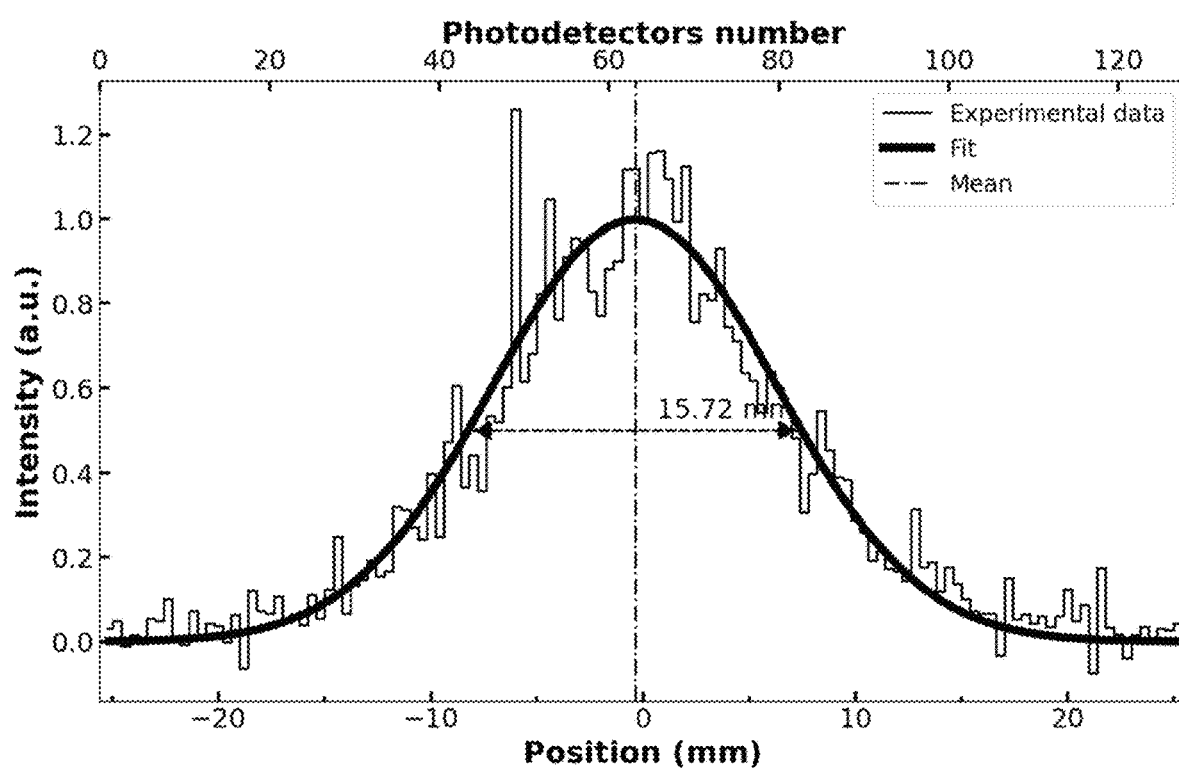
Figure 6:
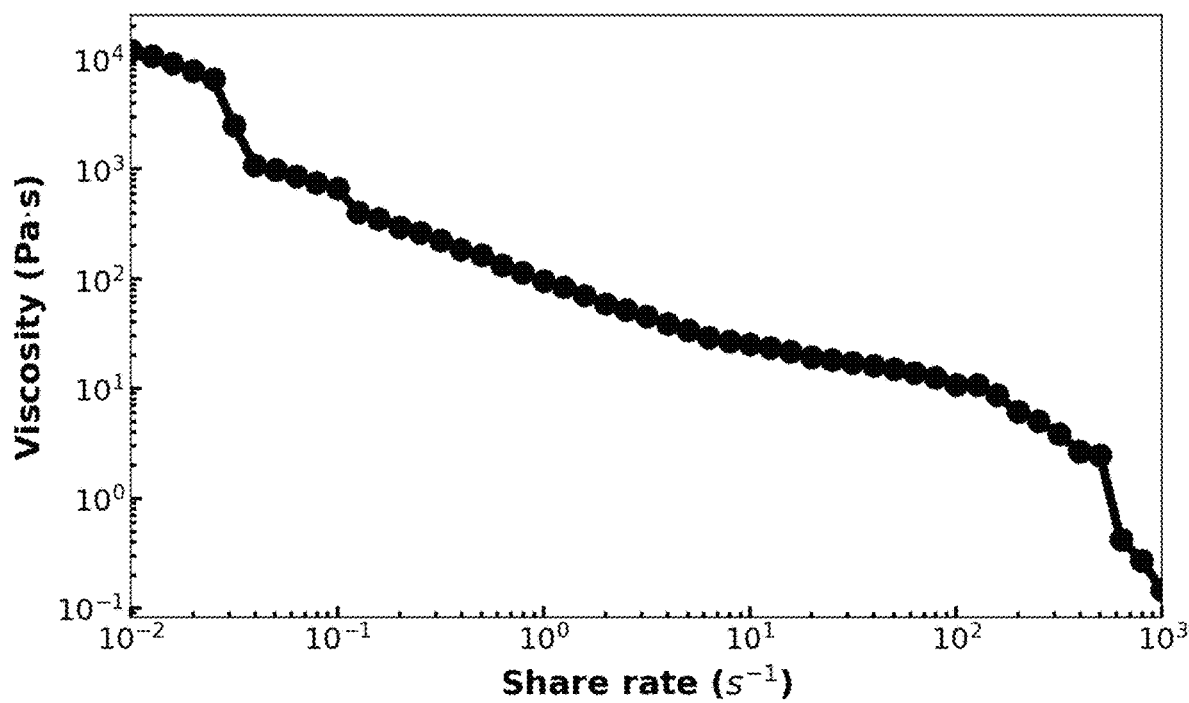
FIG. 6 is showing a graph representing the rheological characterization of the scintillation resin SR, with a relationship between the viscosity of the scintillation resin SR as a function of the shear rate, showing working conditions.

Different experimental results have been performed with an exemplary scintillation structures 50, for example columns, as manufactured by the herein described method 100, and FIGS. 5A to 5C show different graphs illustrating proton beams that have been received by a photodetectors PD having an exemplary number 128 of photodetector diodes that match with an exemplary number of 128 columns, forming waveguides, with a column pitch of 400 µm and a column width of 200 µm, showing the reproduction of the Gaussian distribution of the original proton beam at different energies, with FIG. 5A showing a graph with the read signal intensity as a function of a number of a photodetector from the array of photodetectors PD that is capturing the light emitted from the columns of scintillation structures 50 with a beam energy of 150 MeV, FIG. 5B showing a graph for the beam energy of 178 MeV, and FIG. 5C showing a graph for the beam energy of 220 MeV. With a filter or fitting algorithm, the original Gaussian distribution of the proton beam can be reconstrued with great accuracy. The intensity values at the abscissa have been normalized between zero (0) and one (1) after the fitting of the experimental data measured or captured from the photodetectors.

In sum, with the herein presented method 100 it has been made possible to use the scintillating resin as active material, which has not been a straightforward process requiring a substantial research and development. The method 100 and the scintillation detector active structure 50 obtained from the method can address the disadvantages associated with the existing devices. In particular, method 100 can be applied to any design of the active area within the dimension of a substrate, for example a silicon microelectronics wafer, with extremely small features, down to a few micrometers. Following this procedure, one can shape scintillating resins in a different way, combining different designs, to create different types of scintillation detector active structure 50. With the integration of photodetection and readout systems, beam profilers with a high spatial resolution can be realized. Unlike the fiber-based devices, where the dimensions of the fibers of about 250 µm limit the spatial resolution, with the herein presented method 100 and scintillation detector active structure 50, the limitation is given by the microfabrication techniques, for example the photolithography that can be used in step S10. Also, due to the solidification of the scintillation resin, it also possible to use the scintillation detector devices 100 in a vacuumized environment, for example within the vacuum system of a particle accelerator device or other type of radiation imaging device.

Because structural features having microscopic dimensions, or even nanoscopic dimensions can be easily achieved with microfabrication techniques, coupling scintillating active areas, realized with the herein presented method 100, with a detection system using photodetectors, it is possible to provide for imaging systems that can have a very high resolution, for example offering a resolution of only a few micrometers. The currently available commercial photodetectors can be used only up to features of 100 µm, because there are no commercial photodetectors available having a pitch that is smaller of 200 µm. However, in case smaller however, it is possible to use imaging sensors, such as a CCD or a CMOS camera, where the resolution limit is given by the size of a pixel, which can be few microns.

In addition, the method 100 permits the manufacturing of large and very cheap scintillating active areas as structures 50, which makes is possible to easily replace damaged scintillators, for example due to radiation damage. Producing wafers silicon and polymeric molds is a standard and inexpensive procedure. Once the silicon and polymeric molds are ready, they can be used multiple times as molds to repeatedly make scintillation detector active structures 50. This means that the only costs of the final device are due to the scintillating material and the electronics. Another advantage of the herein presented method is the possibility to rapidly manufacture a large number of scintillation detector active structures 50. This opens the possibility for cost-effective mass production. Furthermore, the fabrication yield of the proposed fabrication processed is very high as it can be standardized without critical passages.

While the invention has been disclosed with reference to certain preferred embodiments, numerous modifications, alterations, and changes to the described embodiments, and equivalents thereof, are possible without departing from the sphere and scope of the invention. Accordingly, it is intended that the invention not be limited to the described embodiments, and be given the broadest reasonable interpretation in accordance with the language of the appended claims.

The invention claimed is:

1. A method for manufacturing a scintillation detector structure comprising:
   forming a plurality of first structures into a surface of a substrate to form a patterned substrate;
   filling the plurality of first structures and covering the surface of the substrate with a polymeric material;
   hardening the polymeric material and first removing the hardened polymeric material from the patterned substrate to obtain a polymeric mold with a patterned surface having a plurality of second structures;
   performing a surface cleaning treatment and a silanization of the patterned surface of the polymeric mold;
   filling the plurality of second structures and covering the patterned surface of the polymeric mold with a moldable scintillation material;
   polymerizing the scintillation material while exerting a pressure on the scintillation material; and
   second removing the polymerized scintillation material from the plurality of second structures of the polymeric mold to obtain scintillation detector active structures.

2. The method of claim 1, wherein the polymeric material includes Polydimethylsiloxane (PDMS).

3. The method of claim 1, wherein the step of filing is performed by pouring or by spin-coating.

4. The method of claim 1, wherein the step of first removing is performed by demolding the hardened polymeric material from the patterned substrate by peeling.

5. The method of claim 1, wherein the step of second removing is performed by demolding the polymerized scintillation material.

6. The method of claim 1, wherein the step of second removing is performed by dissolving the polymeric mold with a solvent.

7. The method of claim 1, wherein performing the surface cleaning treatment includes an oxygen plasma treatment.

8. The method of claim 1, wherein the performing the silanization of the patterned surface of the polymeric mold is done by using a perfluoro-terminated silane to increase a hydrophobicity of the patterned surface of the polymeric mold creating a fluorinated monolayer.

9. The method of claim 1, wherein the step of forming the plurality of first structures includes a photolithography process to form the first structures.

10. The method of claim 1, wherein the first and second structures include channels, and the scintillation detector active structures include scintillator columns.

11. The method of claim 1, wherein the first and second structures include grids, and the scintillation detector active structures include scintillator grids.

12. The method of claim 1, wherein the scintillation detector active structures do not have a cladding layer.

13. A scintillation detector structure manufactured by the method of claim 1.

* * * * *